(12) United States Patent
Oashi et al.

(10) Patent No.: US 6,424,041 B1
(45) Date of Patent: Jul. 23, 2002

(54) SEMICONDUCTOR DEVICE

(75) Inventors: Toshiyuki Oashi, Hyogo; Takashi Uehara, Osaka, both of (JP)

(73) Assignees: Mitsubishi Denki Kabushiki Kaisha, Tokyo; Matsushita Electric Industrial Co., Ltd., Osaka, both of (JP)

( * ) Notice: Subject to any disclaimer, the term of this patent is extended or adjusted under 35 U.S.C. 154(b) by 0 days.

(21) Appl. No.: 09/848,207

(22) Filed: May 4, 2001

(30) Foreign Application Priority Data

Aug. 18, 2000 (JP) ........................ 2000-248572

(51) Int. Cl.[7] .................... H01L 23/48; H01L 23/52
(52) U.S. Cl. ............................ 257/751; 257/754
(58) Field of Search ..................... 257/751, 754, 257/758

(56) References Cited

U.S. PATENT DOCUMENTS 5,336,911 A * 8/1994 Furuhata
6,239,021 B1 * 5/2001 Pramanick et al.
6,258,654 B1 * 7/2001 Gocho
6,288,447 B1 * 9/2001 Amishiro et al.
6,291,885 B1 * 9/2001 Cabral, Jr. et al.
6,335,570 B2 * 1/2002 Mori et al.

FOREIGN PATENT DOCUMENTS

JP 8-148560 6/1996
JP 10-98011 4/1998
JP 10-256256 9/1998

* cited by examiner

Primary Examiner—Stephen D. Meier
(74) Attorney, Agent, or Firm—McDermott, Will & Emery

(57) ABSTRACT

A semiconductor device having copper wiring and capable of reliably preventing copper atoms from diffusing into a memory storage region even in a slight amount is obtained. This semiconductor device includes on a semiconductor substrate a memory cell portion and a wiring portion including copper wires, and includes in a region surrounding the memory cell portion a copper-diffusion preventing film for blocking diffusion of copper atoms from the wiring portion.

17 Claims, 22 Drawing Sheets

SEMICONDUCTOR DEVICE

BACKGROUND OF THE INVENTION

1. Field of the Invention

The present invention generally relates to a semiconductor device. More particularly, the present invention relates to a semiconductor device that prevents copper of copper wiring from diffusing into a memory storage portion for storing information.

2. Description of the Background Art

With ever-increasing demand to shrink the semiconductor devices in dimensions, the wiring width: has been reduced. Moreover, a wiring material has increasingly changed from aluminum wiring to copper wiring in order to reduce the electrical resistance and also the wiring width. The copper wiring has a reduced wiring width mainly because of the damascene method. Replacing aluminum wiring with copper wiring has the following benefits:

(a) Electrical resistance of the wiring can be reduced, so that the wiring delay time is reduced, and an operation frequency can be increased, resulting in an increased operating speed of the semiconductor device. Reduction in electrical resistance also results in reduced capacity between adjacent wires, whereby the wiring delay time can further be reduced;

(b) Reduction in electrical resistance results in reduced power consumption, and also enables the amount of heat generation to be reduced even with a higher integration degree; and (c) The copper wiring is, normally formed according to the damascene method, so that the copper wiring width can be reduced, resulting in a dimensionally shrunk semiconductor device.

However, copper atoms have a property of easily diffusing into silicon and a silicon oxide film. Therefore, a copper bridge is formed between copper wires, causing short-circuit thereof. Moreover, the copper atoms get into an active region of the silicon substrate, resulting in unsatisfactory characteristics and malfunctioning.

Accordingly, some proposals have been made in order to prevent characteristics of the semiconductor device from being degraded by diffusion of copper atoms from copper wiring through silicon into an active region or the like. For example, the following proposal has been made in order to prevent copper diffusion from a copper-film wiring pattern into an active region of the semiconductor substrate: more specifically, a proposal has been made to form an amorphous barrier film on top and bottom of a copper wiring pattern formed in an upper layer (Japanese Patent Laying-Open No. 10-256256). According to this method, copper does not diffuse from the top and bottom surfaces of the copper film. In addition, the following proposal has been made in order to prevent copper diffusion from a copper wiring layer into a silicon substrate: first, a copper-diffusion barrier film is formed, on the sidewall of a contact hole formed in an interlayer insulating layer and on the bottom and sidewall of a patterned wiring groove in the interlayer insulating layer. Then, a metallic compound mainly comprised of copper is embedded thereon, so that an embedded wiring layer is formed (Japanese Patent Laying-Open No. 10-98011). According to this method, copper does not diffuse downward from the embedded copper wiring layer, and therefore characteristics of an underlying active layer are not degraded. Moreover, the following proposal has been made in order to prevent copper atoms from diffusing from copper wiring into a silicon substrate and oxide film: a copper-diffusion barrier film is formed on the bottom and sidewall of a wiring groove formed in an interlayer insulating film. Then, a,copper film is formed thereon and heated for reflow, so that the copper film is embedded in the wiring groove (Japanese Patent Laying-Open No. 8-148560). This method also prevents the copper atoms from diffusing from the copper film, the wiring layer, into an underlying active region.

However, with the progress in dimensional shrinking of the semiconductor devices, a problematic amount of copper has become far smaller than that is conventionally problematic. More specifically, as shown in FIG. 22, in the case where the copper wiring is used in, e.g., a DRAM (Dynamic Random Access Memory), copper atoms get into capacitors of a memory cell portion in the DRAM, destroying charges corresponding to information. A capacitor has a dielectric film interposed between electrodes, and stores 1-bit information according to presence/absence of accumulated charges in the electrodes. The copper atoms getting into the capacitor cause dissipation of charges within the dielectric, destroying an information storage function. In FIG. 22, a wiring portion 150 is provided over a memory cell portion 130 and a peripheral circuit portion 140, and copper wires 116a and 116b for connecting the corresponding contacts are provided in the wiring portion 150. The copper wires 116a and 116b in the peripheral circuit portion are connected through corresponding contacts 109c and 113c to corresponding source/drain regions 106 formed with a respective gate electrode 104 interposed therebetween. Gate electrodes 104 are arranged in the memory cell portion 130, and a lift pad 108 extends from each active region located between the gate electrodes 104. A capacitor contact 111 is formed on the lift pad 108, and a capacitor 112 comprised of a lower electrode 112a, a dielectric 112b and an upper electrode 112c is connected thereto. When this semiconductor device is subjected to heat during the manufacturing process, copper atoms diffuse from the copper film into the capacitors in the memory cell portion 130. Moreover, while the finished semiconductor device is in use, the copper atoms move into the capacitors due to electrodiffusion. The capacitors are destroyed even when the above-mentioned conventional measures are taken to prevent copper diffusion. Accordingly, the problematic amount of copper herein is far smaller than the conventionally problematic amount. Therefore, in the field of semiconductor devices, development of semiconductor devices sustaining a stable memory cell operation for a long time while still having the above-mentioned benefits of copper wiring has been strongly demanded.

SUMMARY OF THE INVENTION

It is an object of the present invention to provide a semiconductor device capable of reliably preventing diffusion of copper atoms even in a slight amount, and also capable of easily forming means for preventing the copper diffusion.

The semiconductor device of the present invention has a memory storage portion and a wiring portion including a copper wire apart from the memory storage portion on a semiconductor substrate. The semiconductor device includes copper diffusion blocking means provided in a region surrounding the memory storage portion for blocking copper diffusion from the wiring portion toward the memory storage portion.

The region surrounding the memory storage region is located away from the copper wire. Therefore, in this region, the driving force for diffusion of copper atoms is small. Since the copper-diffusion blocking means is provided in this region, diffusion of copper atoms can be reliably prevented even in a slight amount. Moreover, the copper-diffusion blocking means provided in this region allows for a simple structure that is easy to produce. Therefore, with the copper-diffusion blocking means having a simple shape, diffusion of copper atoms into the memory storage portion that destroys information therein can be prevented while still enjoying the benefits of copper wiring.

The memory storage portion as used herein mainly indicates a memory storage portion of the type that stores information corresponding to presence/absence of charges. However, the present invention is not limited to this. Semiconductor devices for storing information corresponding to presence/absence of charges include a DRAM (Dynamic Random Access Memory), EPROM (Erasable Programmable Read Only Memory) including a flash memory, EEPROM (Electrically Erasable Programmable Read Only Memory), and charge-transfer sequential access memory. When copper gets into the memory storage portion of this type, the amount of accumulated charges therein is significantly varied. In other words, such semiconductor devices are highly sensitive to copper as impurities. Semiconductor devices having the highest copper sensitivity include a DRAM for storing information corresponding accumulated charges in a capacitor. The DRAM stores 1-bit information according to presence/absence of accumulated charges in a capacitor provided for each transistor. More specifically, in the DRAM, capacitors in a memory cell portion, i.e., in the memory storage portion, share the information storage function. Therefore, copper diffusion into the memory cell portion causes malfunctioning of the DRAM, so that the DRAM no longer functions as DRAM. Copper wiring using the damascene method is effective in dimensionally shrinking the devices. However, as the devices are increasingly shrunk, the distance between a copper wire and memory cell portion is reduced, whereby the copper atoms are more likely to diffuse into the memory cell portion. Therefore, in the case where the copper wiring that is effective for shrinking is used in a semiconductor device having memory cells including capacitors, provision of the copper-diffusion blocking means is very important.

Note that the barrier layer mentioned in background of the invention is desirably formed on the copper wire. The term "diffusion" as used herein refers to almost all the copper-moving phenomena including movement due to thermal diffusion and electrodiffusion. The copper diffusion as used herein includes diffusion of copper atoms and diffusion of copper ions. Herein, copper atoms and copper ions are not specifically distinguished, and are simply referred to as copper atoms or copper.

In the semiconductor device of the present invention, the region surrounding the memory storage portion includes, for example, a top-surface region and a side-surface region of the memory storage portion, and the copper-diffusion blocking means can be located in at least one of the top-surface region and the side-surface region.

The top-surface region: of the memory storage portion refers to a region that is opposite to the semiconductor substrate with the memory storage portion therebetween and that overlaps the memory storage portion as viewed two-dimensionally The side-surface region of the memory storage portion refers to a vertical-wall region that extend to cross the semiconductor substrate and that surrounds the memory storage portion as viewed two-dimensionally. The top-surface region and the side-surface region are in contact with each other, and located in a region between the memory storage portion and the wiring portion. According to the above-mentioned structure, every part of the wiring portion cannot linearly lead to any part of the memory storage portion without passing through at least one of the top-surface region and side-surface region. By providing the copper-diffusion blocking means in at least one of the top-surface region and the side-surface region, the amount of copper diffusing from the copper wire into the memory storage portion is reduced, whereby destruction of the memory is suppressed. The copper-diffusion blocking means may be located across the whole region of at least one of the top-surface region and the side-surface region, or may be located in a part of at least one of the top-surface region and the side-surface region.

In the semiconductor device of the present invention, copper-diffusion blocking means that is provided in the top-surface region out of the copper-diffusion blocking means is desirably located across the whole top-surface region.

With such a structure, copper atoms are reliably prevented from diffusing through the top-surface region into the memory storage portion. As a result, destruction of the information storage function of the memory is significantly suppressed.

In the semiconductor device of the present invention, copper-diffusion blocking means that is provided in the side-surface region out of the copper-diffusion blocking means is desirably located across the whole side-surface region.

With such a structure, copper atoms are reliably prevented from diffusing through the side-surface region into the memory storage portion. As a result, destruction of the information storage function of the memory is significantly suppressed. In the present invention, copper-diffusion blocking means may be provided so as to cover whole range of the region surrounding the memory storage portion or may be provided so as to occupy a part of the region, as far as it blocks copper diffusion to the memory storage portion.

In the semiconductor device of the present invention, the region surrounding the memory storage portion includes a top-surface region and a side-surface region of the memory storage portion, and the copper-diffusion blocking means can be located, for example, across a whole region of both the top-surface region and the side-surface region.

By providing the copper-diffusion blocking means across the whole region of both the top-surface, region and side-surface region, copper diffusion from the wiring portion into the memory storage portion can be reliably prevented, so that even a slight amount of copper does not diffuse into the memory storage portion. More specifically, copper is prevented from diffusing into the memory storage portion even in a slight amount due to thermal diffusion during manufacturing of the semiconductor device and electrodiffusion during use thereof. As a result, a reliable semiconductor device operating stably for a long time while still having the benefits of copper wiring can be provided.

In the semiconductor device of the present invention, the copper-diffusion blocking means is, for example, a copper-diffusion preventing film.

In this case, the copper-diffusion preventing film can be easily formed during manufacturing process of the semiconductor device by using normal thin-film formation technology. This copper-diffusion preventing film may be formed in parallel with the semiconductor substrate. Alternatively, the copper-diffusion preventing film may be formed as a vertical wall embedded in a trench formed in an insulating film at an angle to the semiconductor substrate.

In the semiconductor device of the present invention, the top-surface region desirably includes an insulating film located over the memory storage portion, and the copper-diffusion preventing film is desirably located in the insulating film so as to extend in parallel with a surface of the semiconductor substrate.

Since the insulating film is interposed between the memory storage portion and the copper-diffusion preventing film in the top-surface region, a material forming the copper-diffusion preventing film is not limited to an insulating material, and a metal film may be used.

In the semiconductor device of the present invention, the side-surface region desirably includes an insulating film surrounding the memory storage portion, and the copper-diffusion preventing film is desirably formed like a vertical wall in the insulating film so as to cross a surface of the semiconductor substrate.

The copper-diffusion preventing film in the side-surface region can also be formed from any material, since the insulating film is interposed between the memory storage portion and the copper-diffusion preventing film. As described above, the vertical-wall-like copper-diffusion preventing film can be easily formed by embedding the copper-diffusion preventing film in a trench formed in the insulating film.

In the semiconductor device of the present invention, the memory storage portion may be, for example, a memory storage portion for accumulating and releasing charges according to information.

The memory storage portion for accumulating and releasing charges according to information includes a memory cell portion of the DRAM. The DRAM accumulates and releases the charges in and from capacitors so as to store 1-bit information per capacitor. These capacitors are highly conveniently formed at a high density. By providing the copper-diffusion preventing film, the conveniently formed high-density capacitors can be used as memory cells in a dimensionally shrunk semiconductor device having the benefits of copper wiring. Moreover, since a flash memory such as EPROM and EEPROM also accumulates and releases charges to store information according to presence/absence of the charges, the same effects as those of the DRAM can be obtained.

In the semiconductor device of the present invention, each copper-diffusion preventing film forming the copper-diffusion blocking means may be, for example, any one of a tungsten film, an aluminum film, a silicon nitride film, a tantalum film and a tantalum nitride film.

These films can reliably block diffusion of copper atoms, and have been actually formed in the manufacturing process of the semiconductor devices. Therefore, in the manufacturing process of the semiconductor device of the present invention, a film capable of reliably preventing copper diffusion can be formed without significant modification such as remodeling of an apparatus for manufacturing the semiconductor device, and thus without significant increase in cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the accompanying drawings.

(Embodiment 1)

Figure 1:
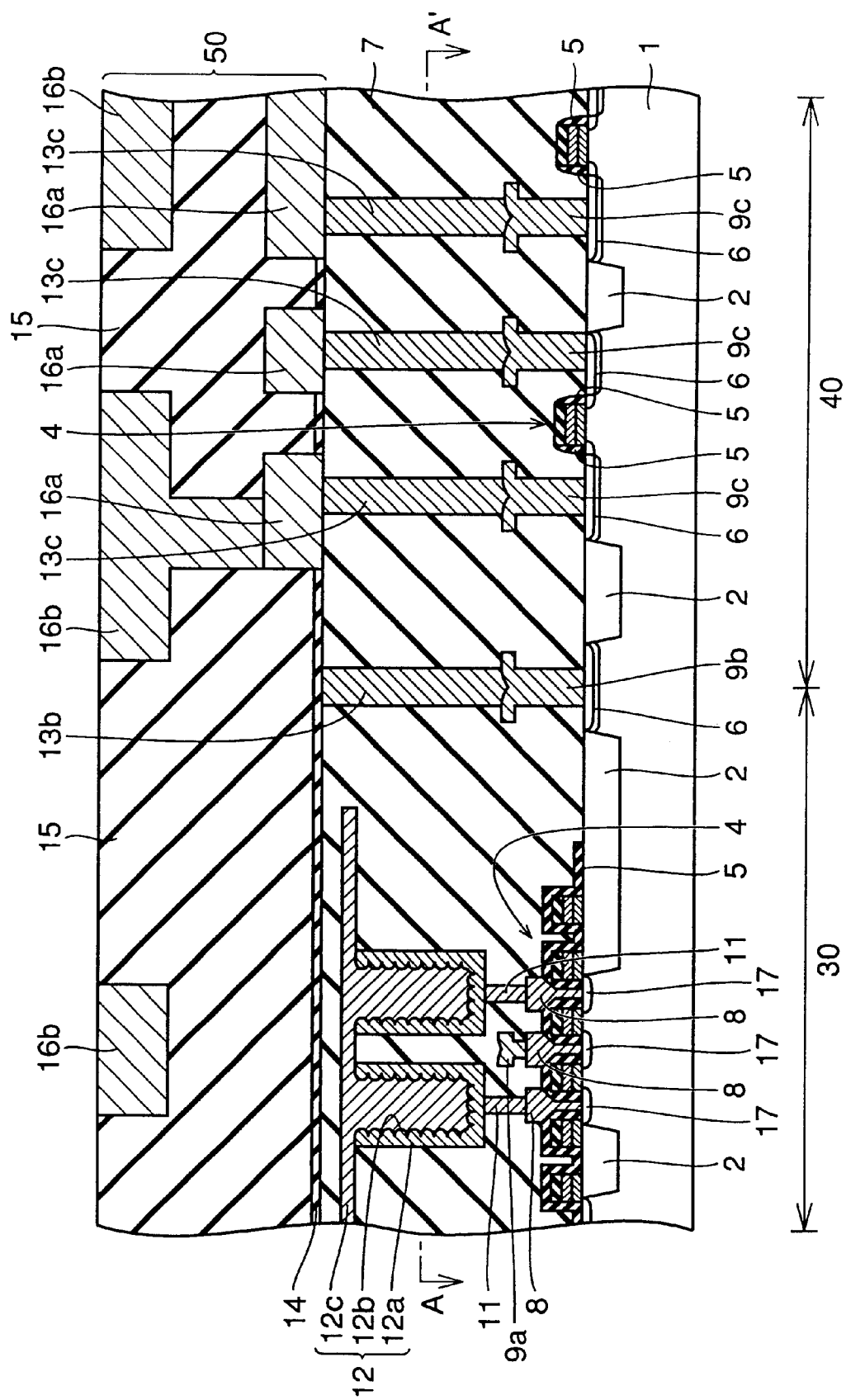
FIG. 1 is a cross sectional view of a semiconductor device according to a first embodiment of the present invention.

In FIG. 1, trench separation bands 2 are formed at a surface of a semiconductor substrate 1, and a memory cell portion 30, i.e., a memory storage region, and a peripheral circuit portion 40 are provided. Gates 4 and source/drain regions 17 with the corresponding gate interposed therebetween are formed in the memory cell portion 30. A lift pad 8 is formed on each source/drain region 17. A bit-line contact and bit line 9a are formed on the lift pads 8 that are not connected to a capacitor. A capacitor 12 is provided on the other lift pads 8 with respective capacitor contacts 11 interposed therebetween.

In the peripheral circuit portion 40, wiring contacts 9c and 13c for connecting source/drain regions 6 with corresponding copper wires 16a in a wiring layer region 50 are formed in an insulating film 7. Copper wires 16a and 16b are formed in an,insulating film 15. A region of the layer having the copper wires located therein is referred to as wiring layer region 50. It is desirable that the above-mentioned conventional measures to prevent short-circuit between copper wires and prevent copper diffusion into an active region, such as formation of a barrier film, are taken to the copper wires in the wiring layer region 50.

In the present embodiment, a ceiling film 14 for preventing copper diffusion is formed on the insulating film 7. The ceiling film 14 is formed from a silicon nitride film. This ceiling film is located away from the copper wires, i.e., at a position where the driving force for copper diffusion is small. Therefore, even a slight amount of copper diffusion can be prevented. This ceiling film 14 extends beyond the top-surface region of the memory cell portion 30 up to above the peripheral circuit region 40. This ceiling film 14 is formed from a non-conductive silicon nitride film. Therefore, the ceiling film 14 extending up to the position dose to the copper wires 16a is not problematic. However, in the case where a copper-diffusion preventing film is formed from a metal film, the copper-diffusion preventing film must extend within the top-surface region of the memory cell portion. Copper-diffusion preventing films 9b and 13b extending like a vertical wall are formed at the boundary between the memory cell portion 30 and peripheral circuit portion 40 so as to surround the side surface of the memory cell portion. This vertical-wall-like copper-diffusion preventing films 9b and 13b are formed from a tungsten film.

Figure 2:
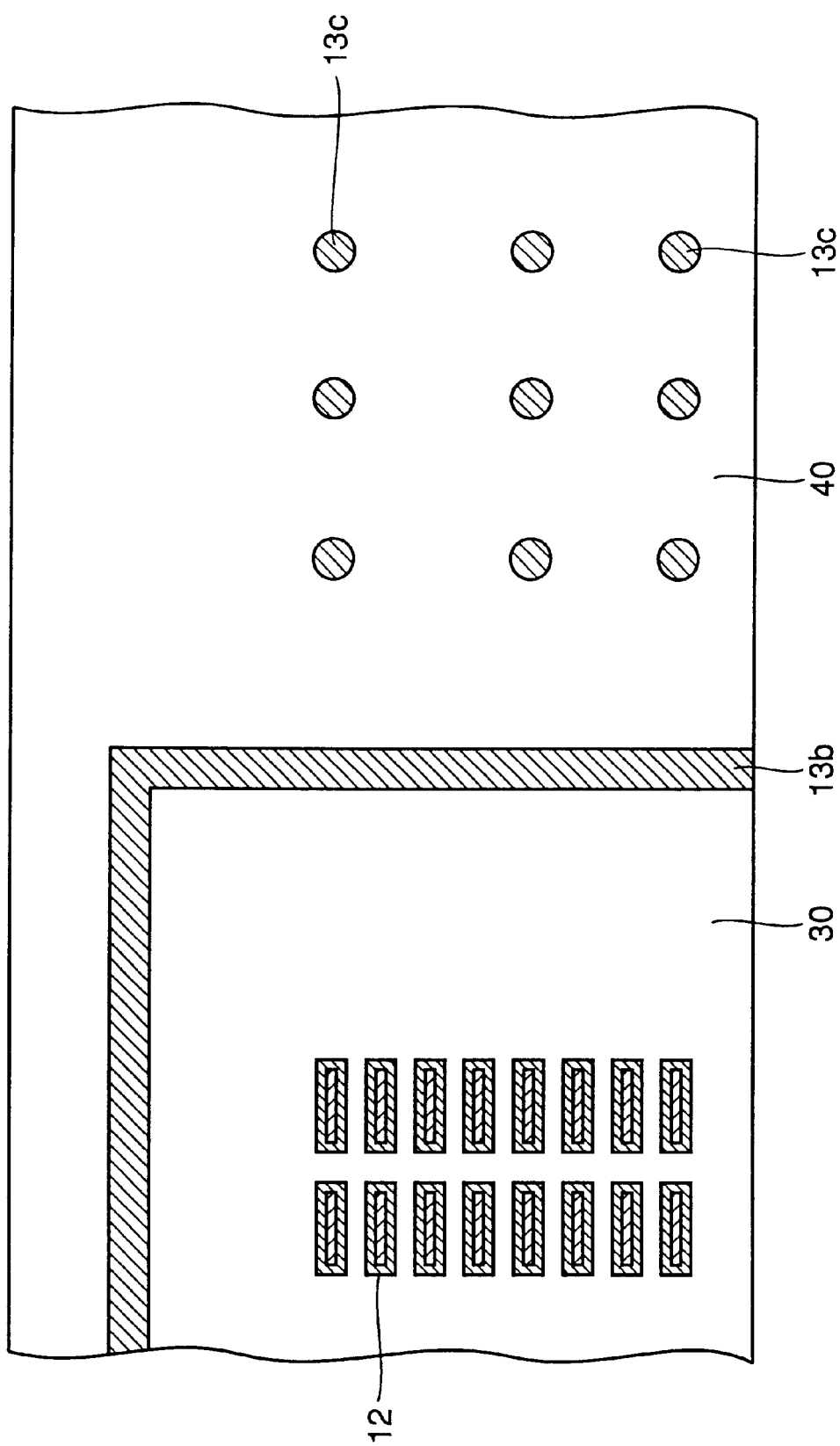
FIG. 2 is a cross sectional view taken along the line A–A' of the semiconductor device of FIG. 1.

Referring to FIG. 2, the memory cell region 30 is surrounded by the vertical wall 13b of the copper-diffusion preventing film so that copper atoms are prevented from diffusing from the copper wires into the memory cell region 30 even in a slight amount. The vertical wall 9b under the vertical wall 13b has a shape similar to that of the vertical wall 13b surrounding the memory cell region 30. The capacitors 12 in the memory cell region 30 are located sufficiently away from the vertical wall, so that copper atoms are prevented from getting into the capacitors 12 even in a slight amount. The contacts 9c and 13c in the peripheral circuit portion 40 need only connect the source/drain regions with the copper wires, and therefore are formed as columnar contacts.

In the present embodiment, in FIGS. 1 and 2, the top-surface region as used herein indicates an upper region of the memory cell region 30 that is located under the copper wires 16b and above the capacitors 12. A side-surface region as used herein indicates a region that is located near the interface between the memory cell region 30 and peripheral circuit region 40, i.e., the interface surrounding the memory cell region 30, and that extends from the surface of the semiconductor substrate to the top-surface region.

The ceiling film 14 and vertical walls 9b and 13b block diffusion of copper atoms from the copper wires 16, so that copper atoms no longer reach the capacitors 12 of the memory cells even in a slight amount. In the present embodiment, a silicon nitride film is used for the ceiling film, and a tungsten film is used for the side vertical walls. However, the ceiling film and side vertical walls may be formed from any material as long as the material prevents copper diffusion. Accordingly, the material of the ceiling film and side vertical walls is not limited to a silicon nitride film, tungsten film, aluminum film, tantalum film, tantalum nitride film, and the like.

Figure 3:
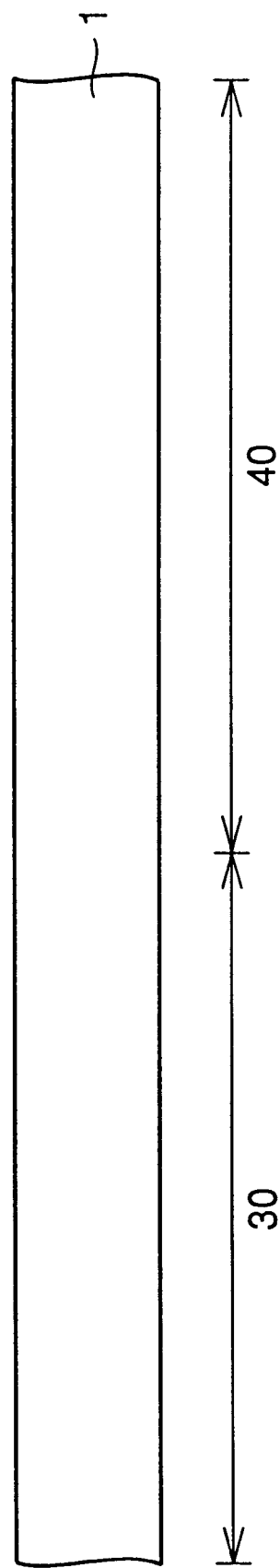
FIG. 3 is a cross sectional view of a silicon substrate used for manufacturing the semiconductor device of FIG. 1.
Figure 4:
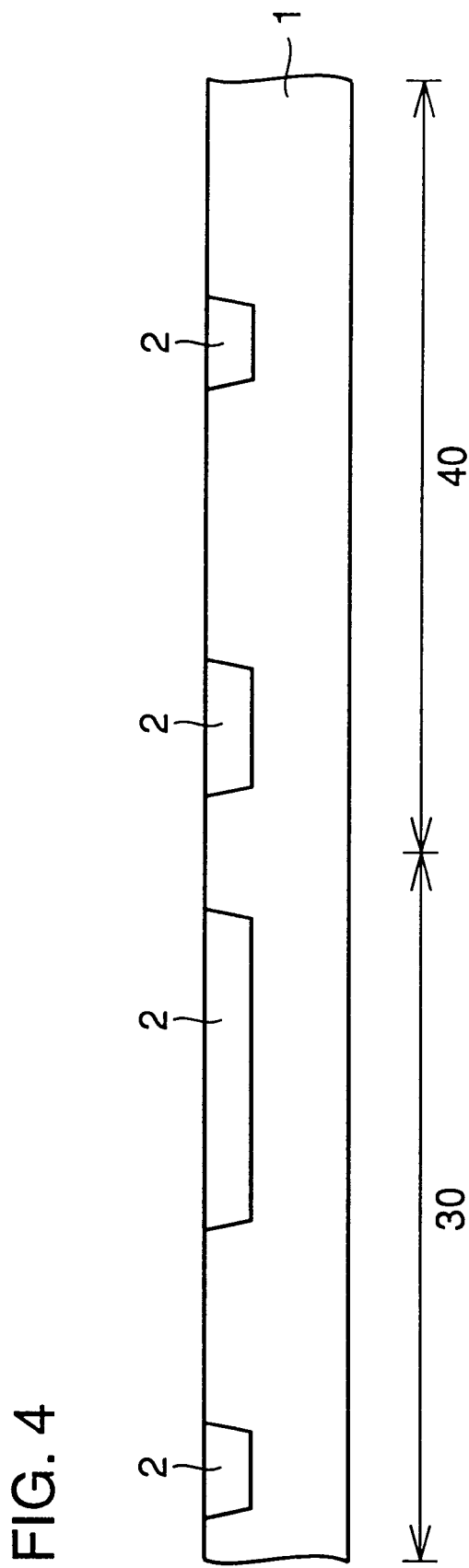
FIG. 4 is a cross sectional view of the stage in which trench separation bands are formed.
Figure 5:
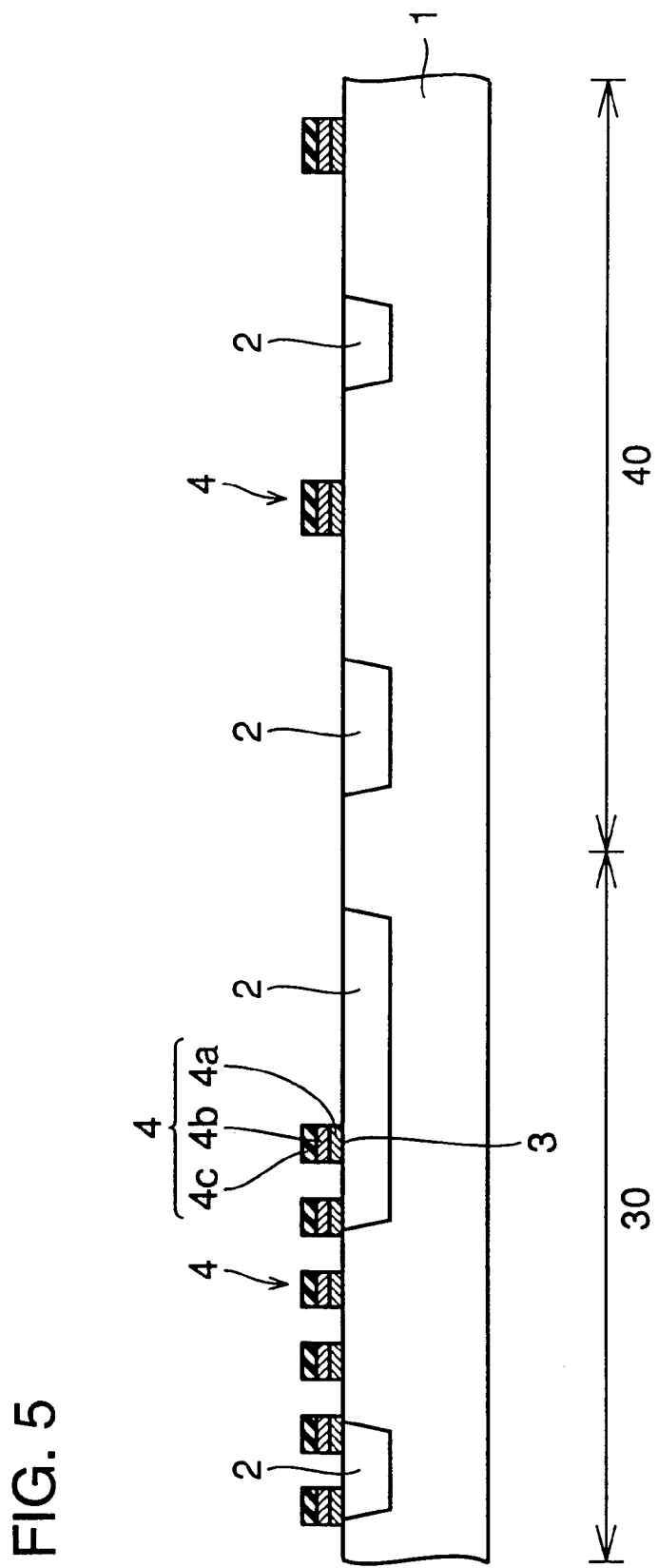
FIG. 5 is a cross sectional view of the stage in which gate electrodes are formed.
Figure 6:
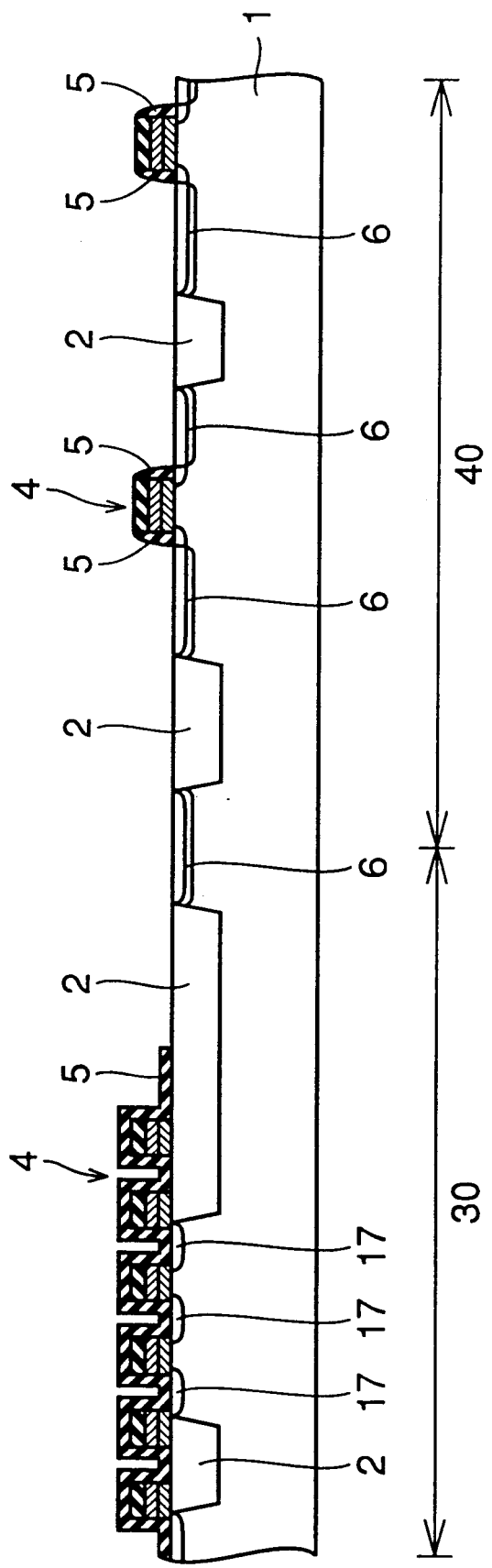
FIG. 6 is a cross sectional view of the stage in which a sidewall of the gate electrodes and source/drain regions are formed.
Figure 7:
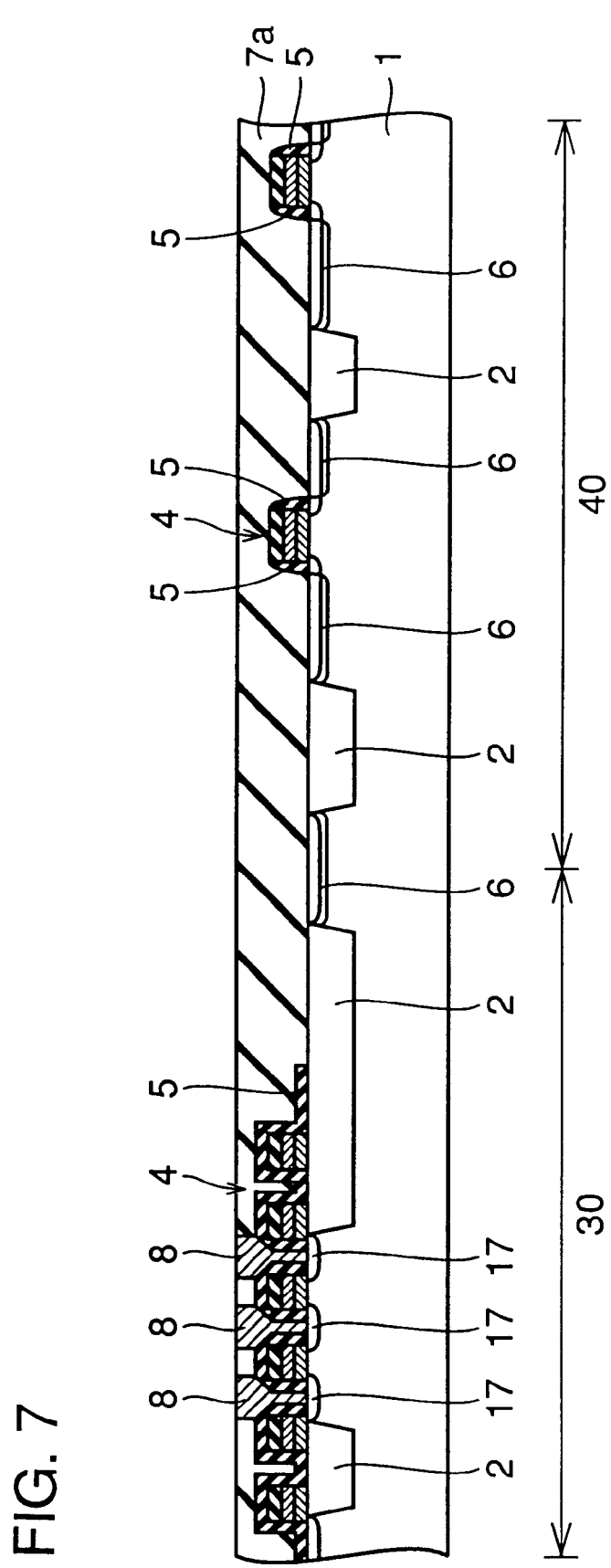
FIG. 7 is a cross sectional view of the stage in which an interlayer insulating film is formed and lift pads are then formed in a memory cell region.
Figure 8:
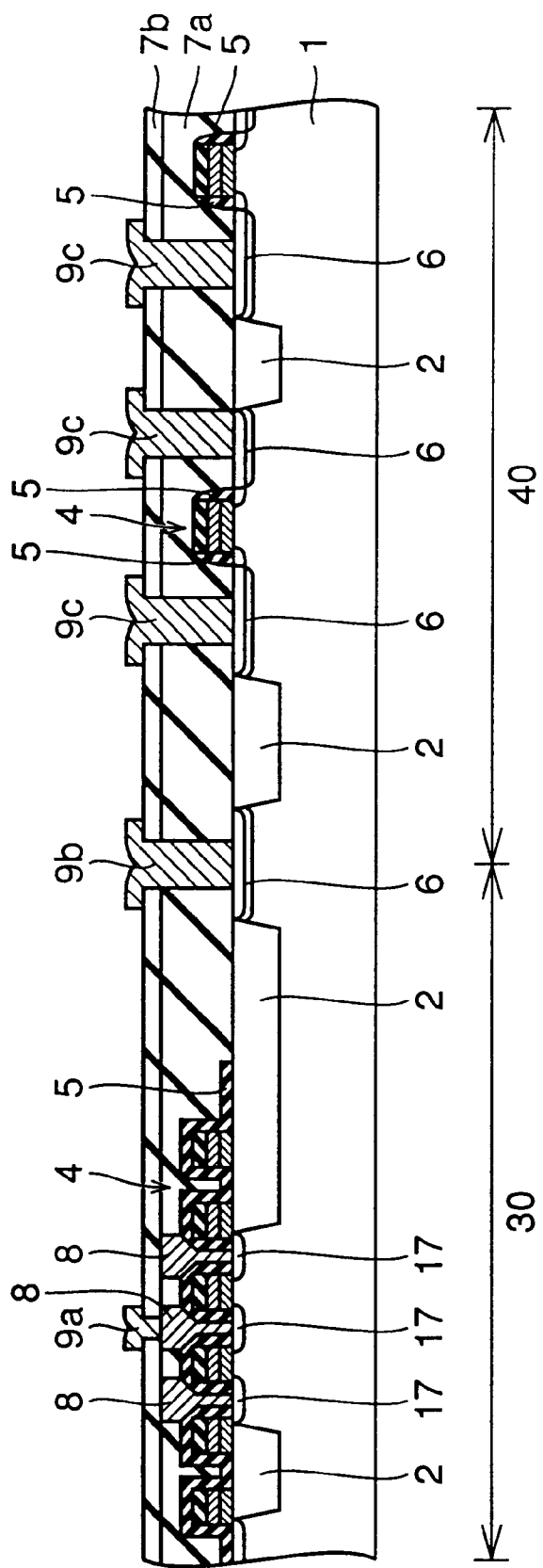
FIG. 8 is a cross sectional view of the stage in which a bit-line contact and bit line are formed in the memory cell region, wiring contacts are formed in a peripheral circuit region, and a vertical wall for preventing copper diffusion is formed near the boundary between both regions.
Figure 9:
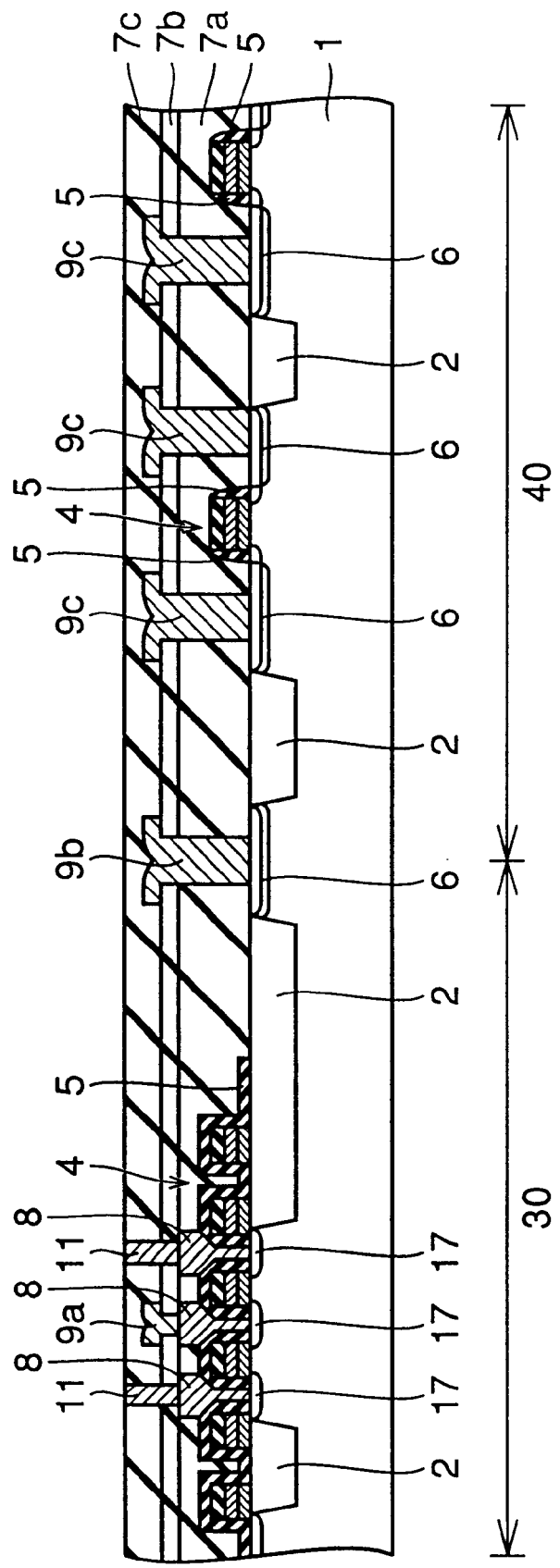
FIG. 9 is a cross sectional view of the stage in which capacitor contacts are formed on the respective lift pads in the memory cell region.
Figure 10:
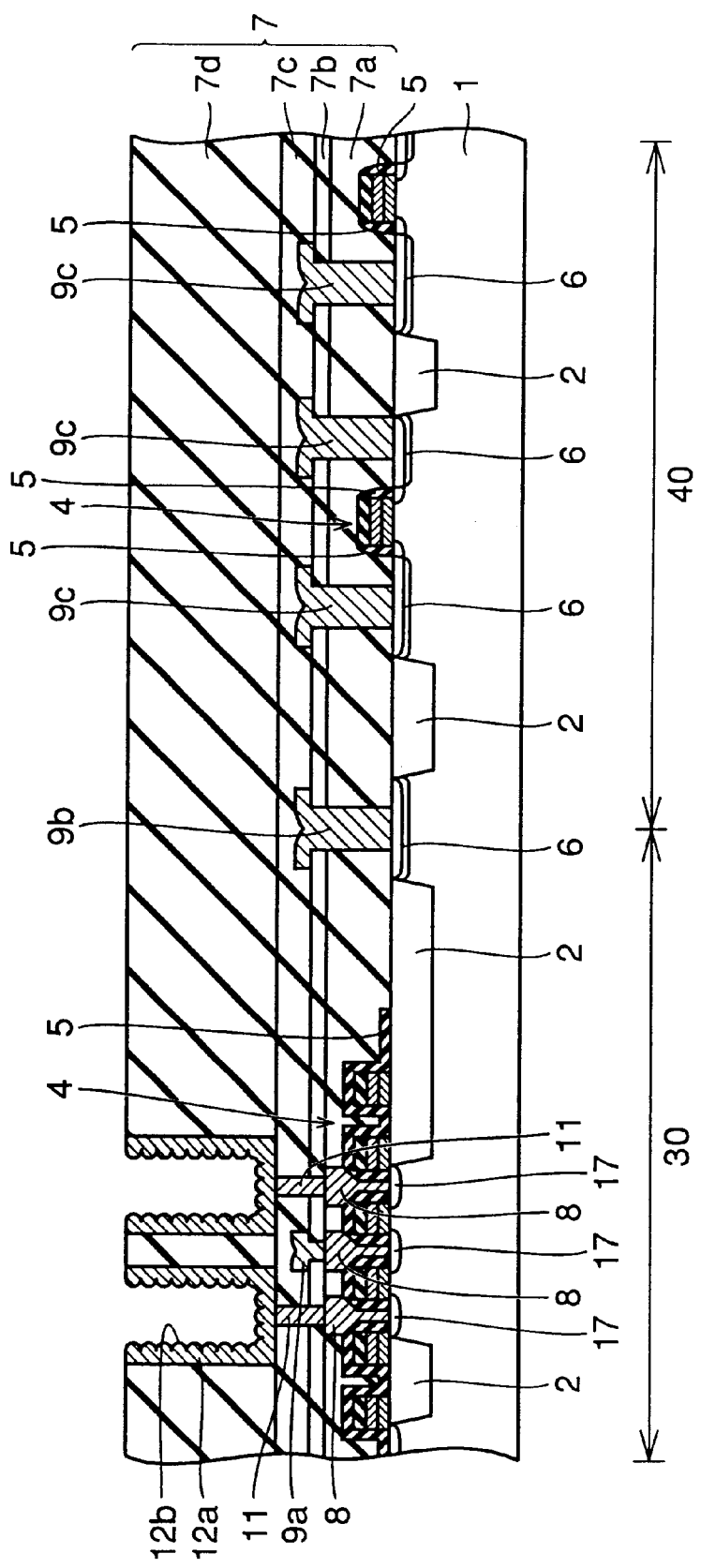
FIG. 10 is a cross sectional view of the stage in which a capacitor lower electrode having a rough surface is formed on the capacitor contacts.
Figure 11:
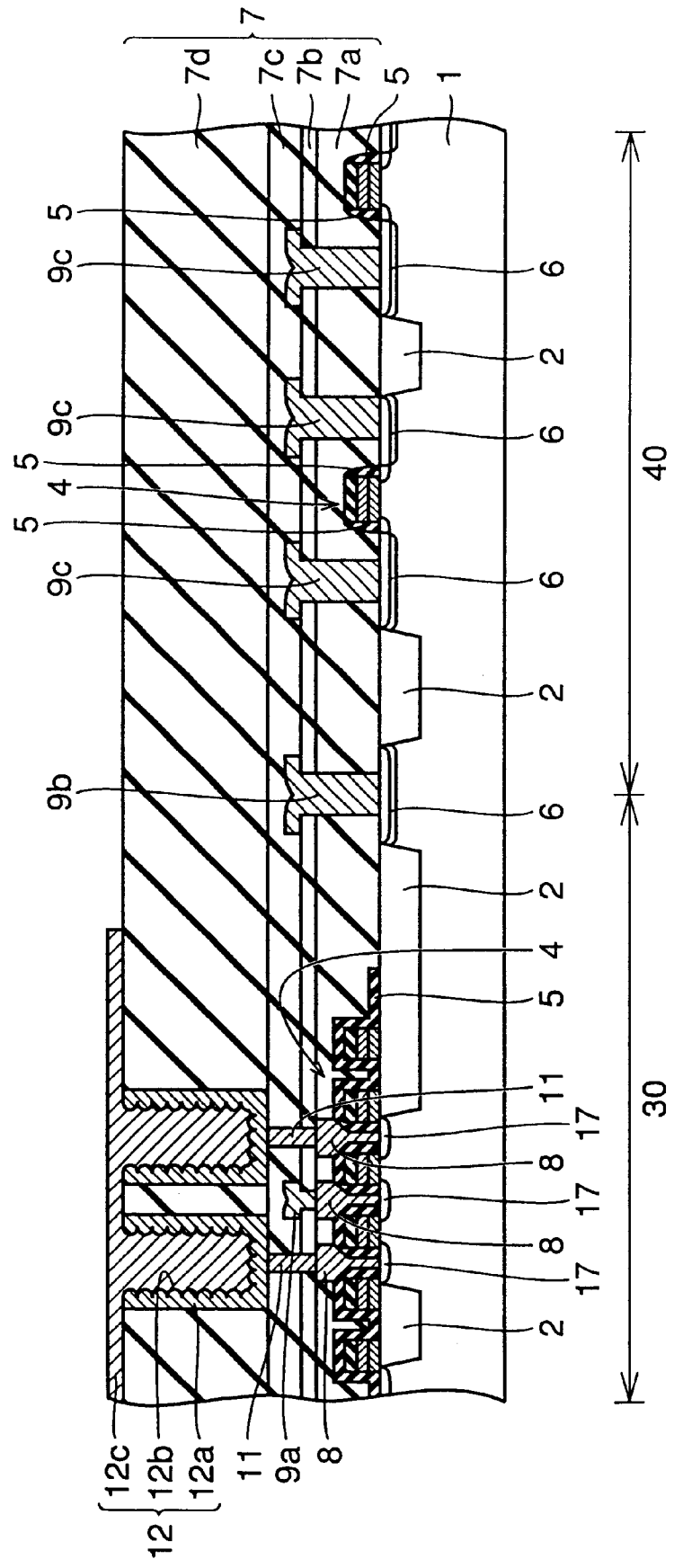
FIG. 11 is a cross sectional view of the stage in which a dielectric film having a rough surface is formed on the capacitor lower electrodes having a rough surface, and a capacitor upper electrode is formed thereon.
Figure 12:
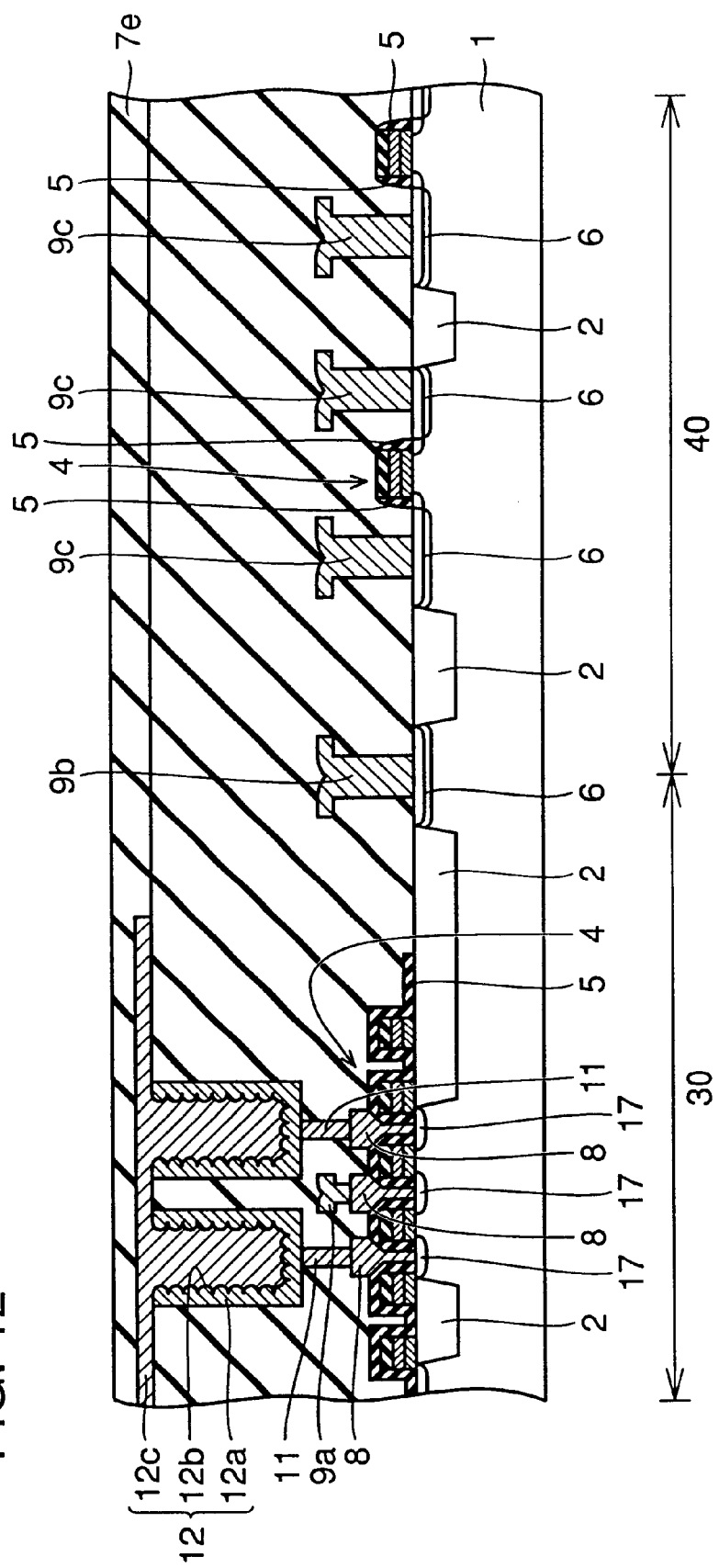
FIG. 12 is a cross sectional view of the stage in which an interlayer insulating film is formed on the capacitors.
Figure 13:
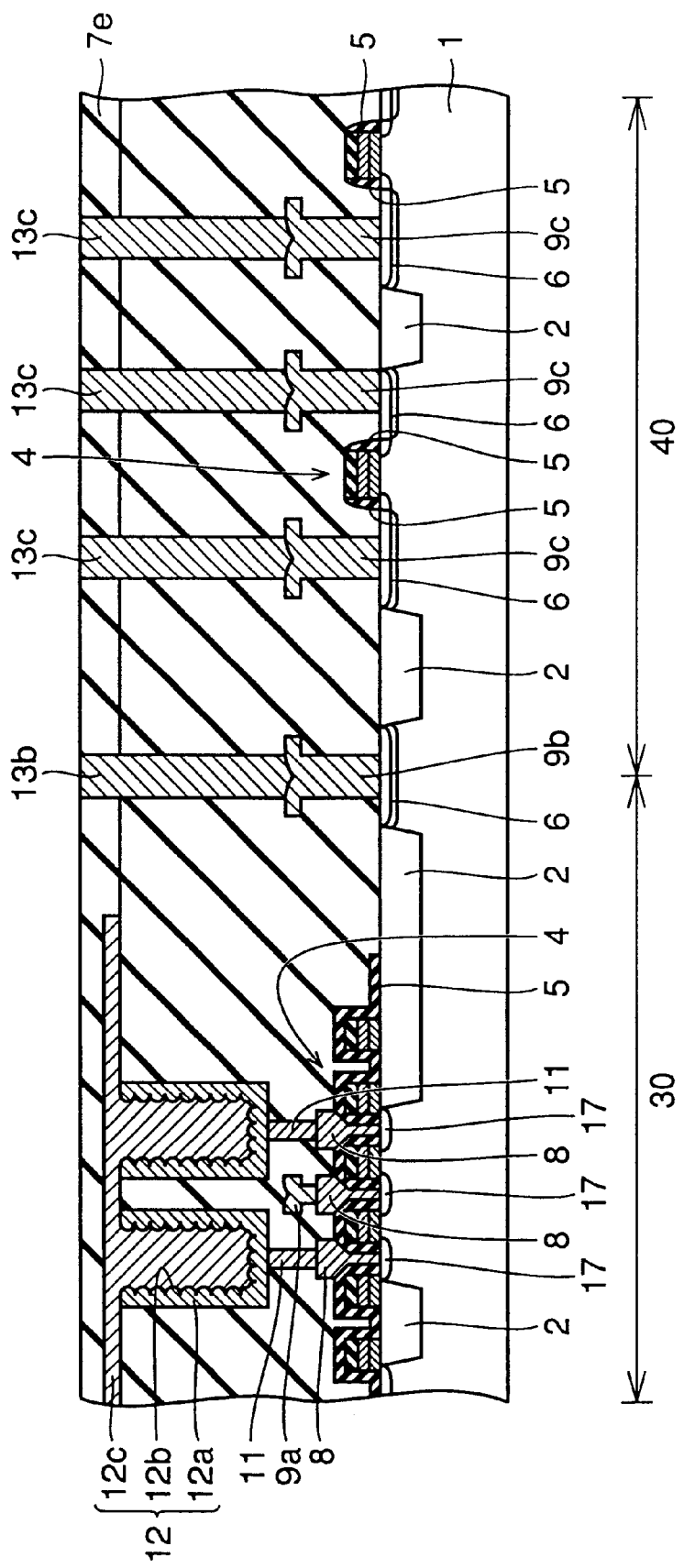
FIG. 13 is a cross sectional view of the stage in which the wiring contacts in the peripheral region and the vertical wall near the boundary are extended upward.
Figure 14:
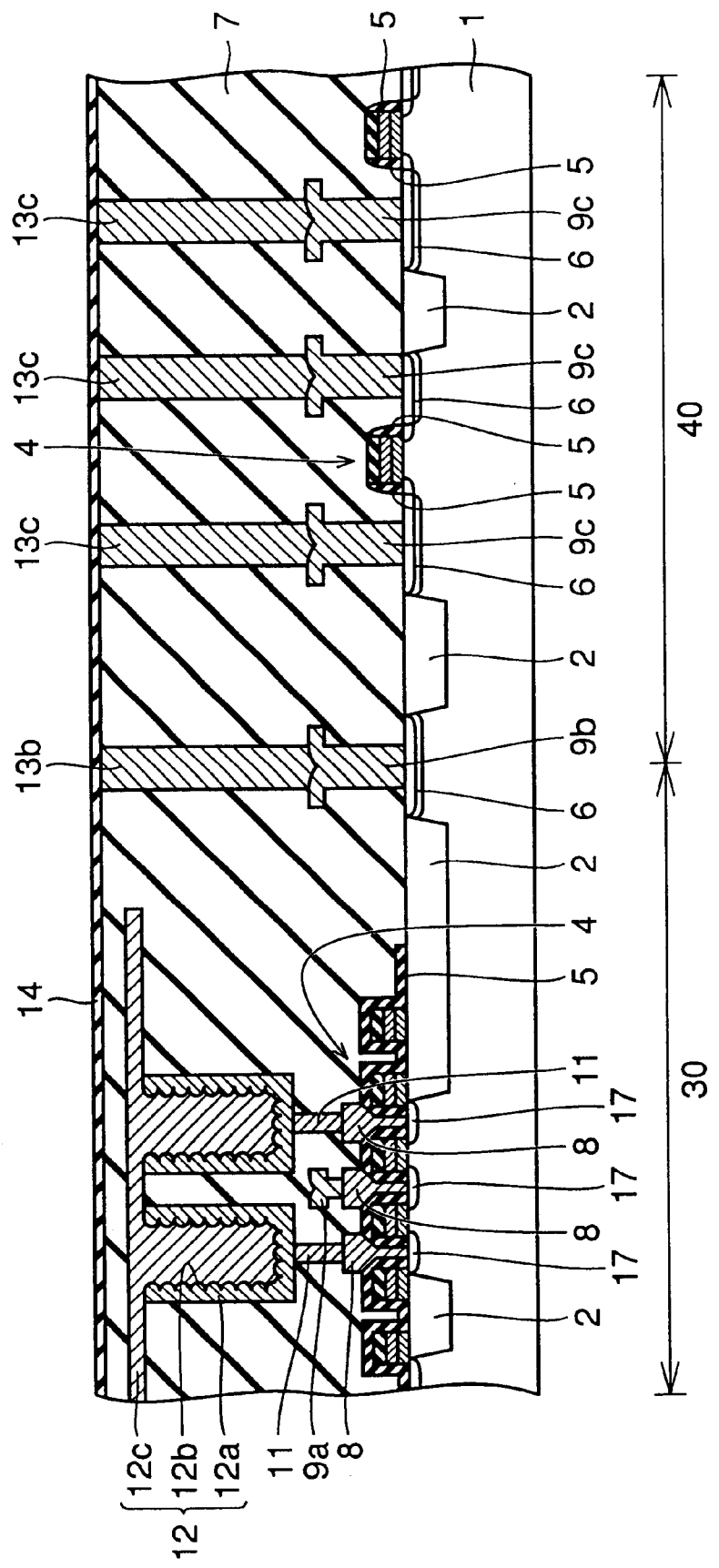
FIG. 14 is a cross sectional view of the stage in which a silicon nitride film having a copper-diffusion preventing function is formed.
Figure 15:
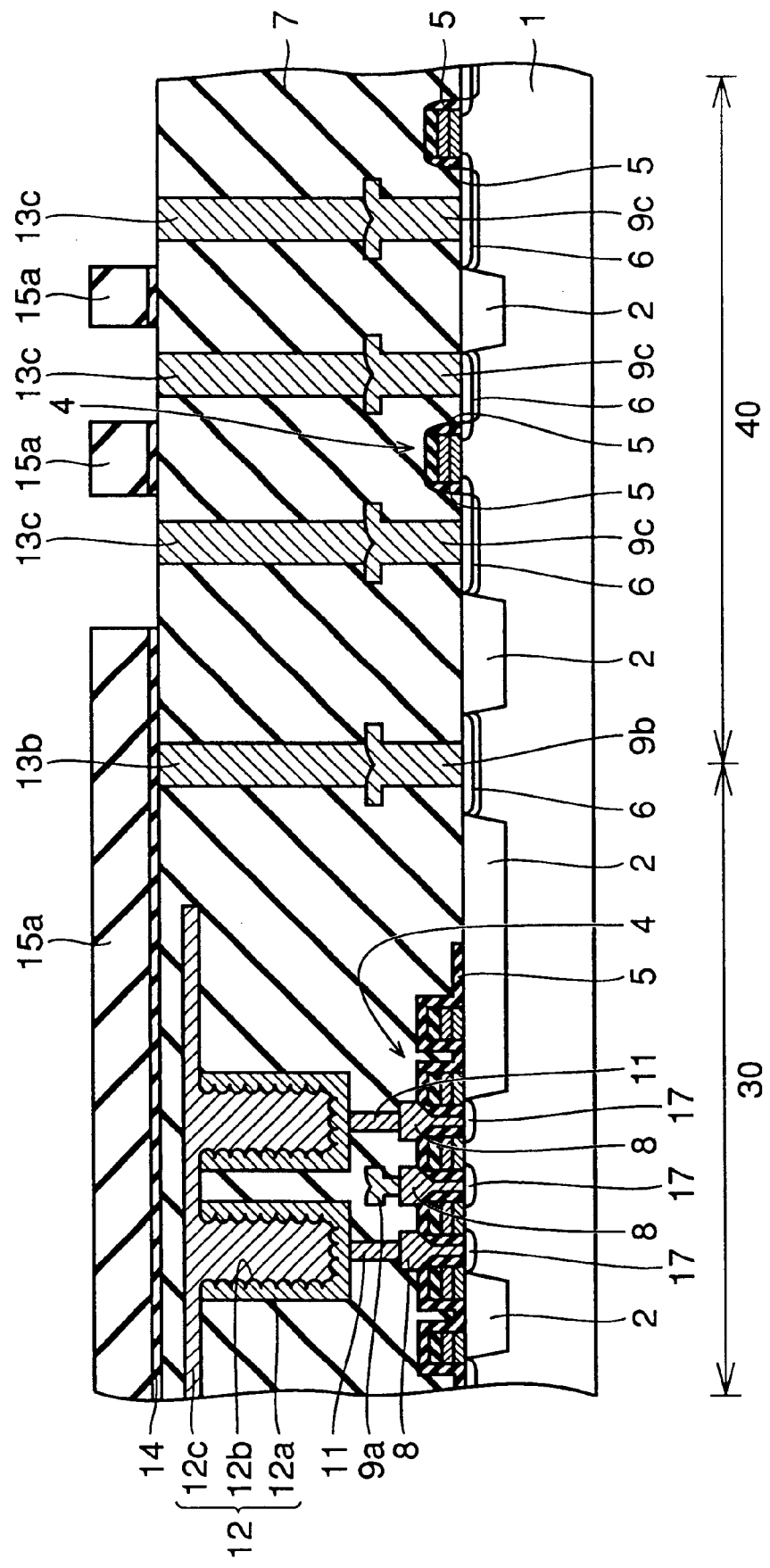
FIG. 15 is a cross sectional view of the stage in which an insulating film is formed and wiring grooves are formed therein.
Figure 16:
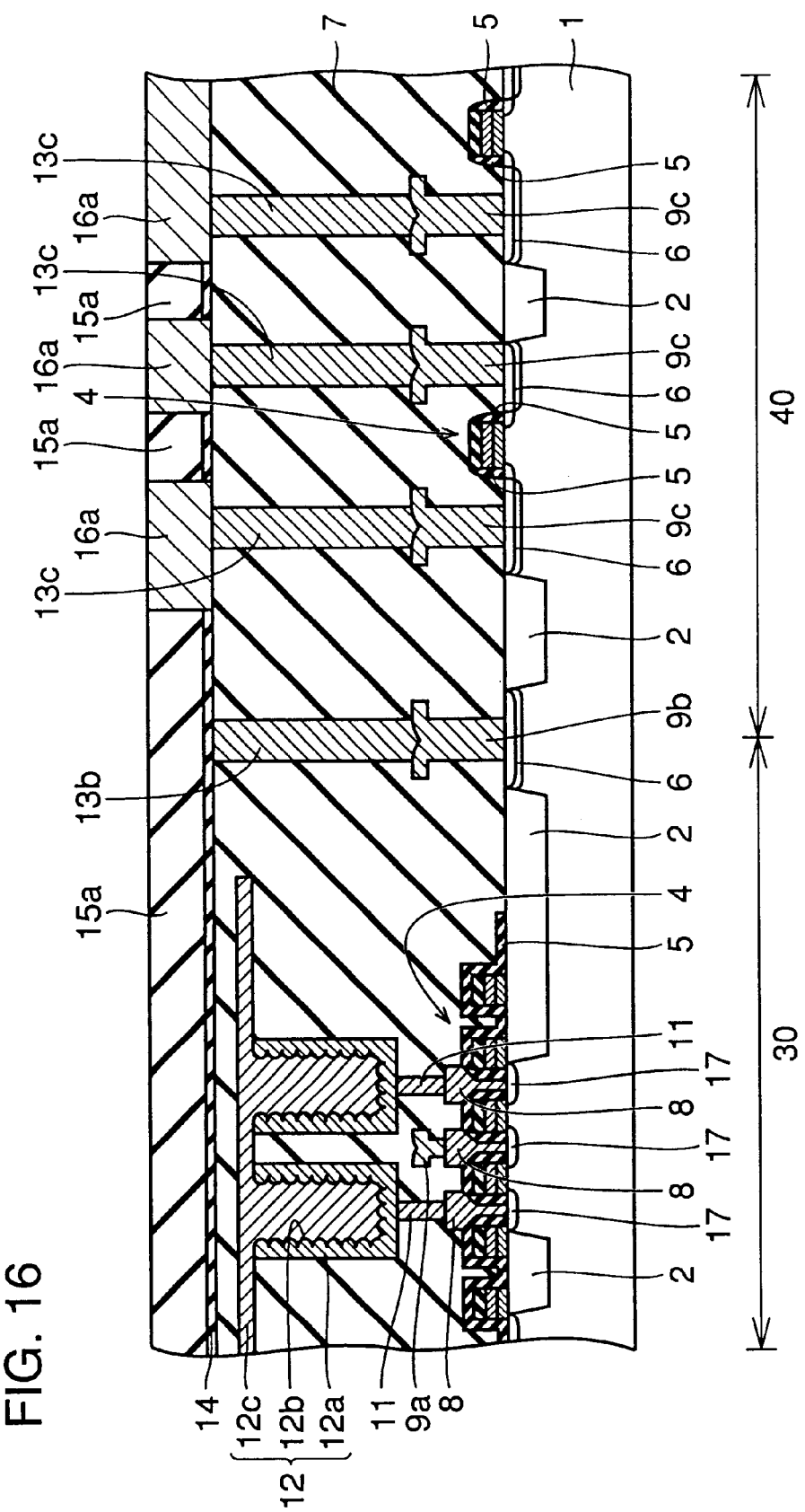
FIG. 16 is a cross sectional view of the stage in which a copper film is embedded in the wiring grooves.
Figure 17:
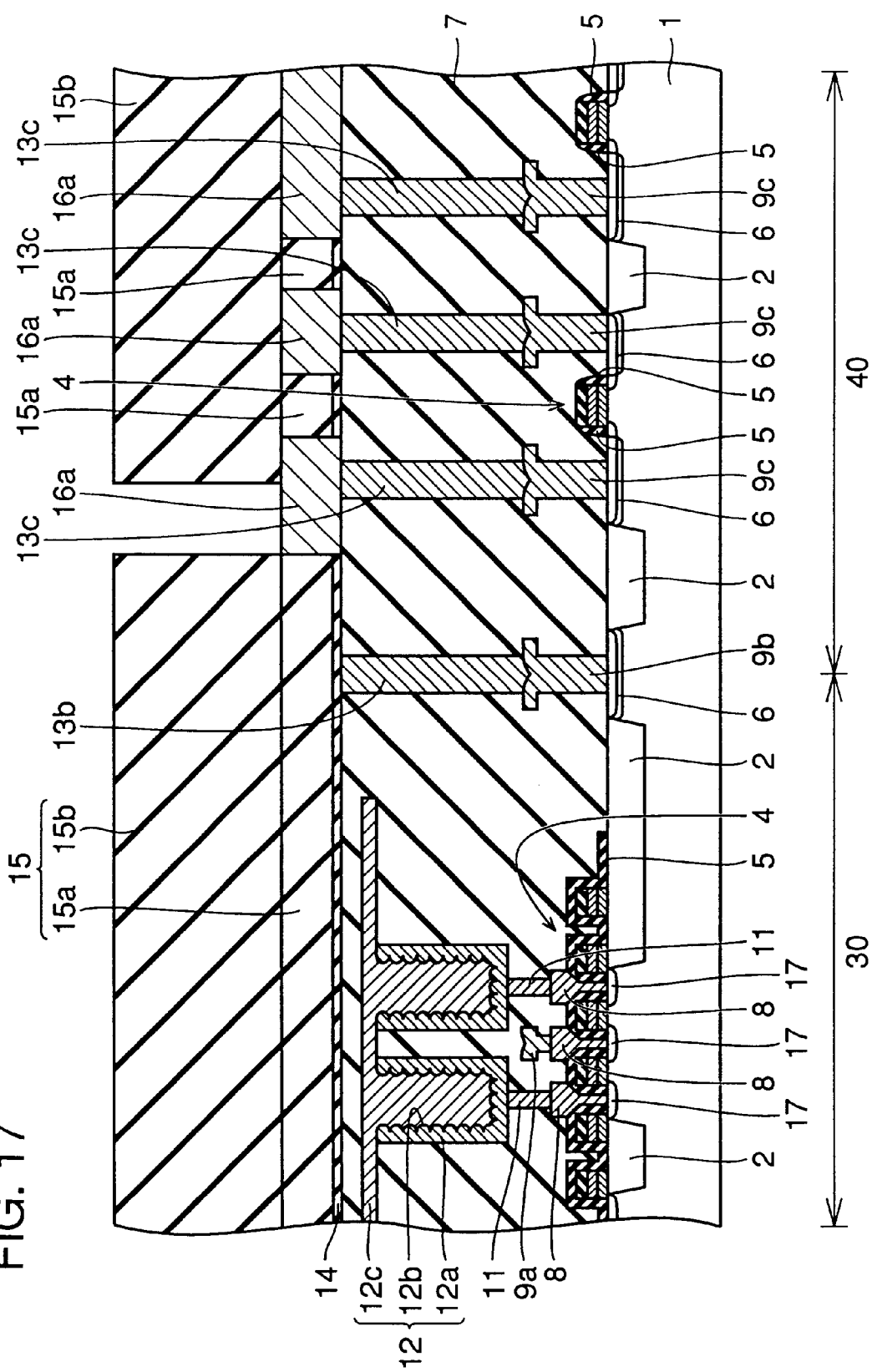
FIG. 17 is a cross sectional view of the stage in which an insulating film is formed and a second wiring contact hole is formed therein.
Figure 18:
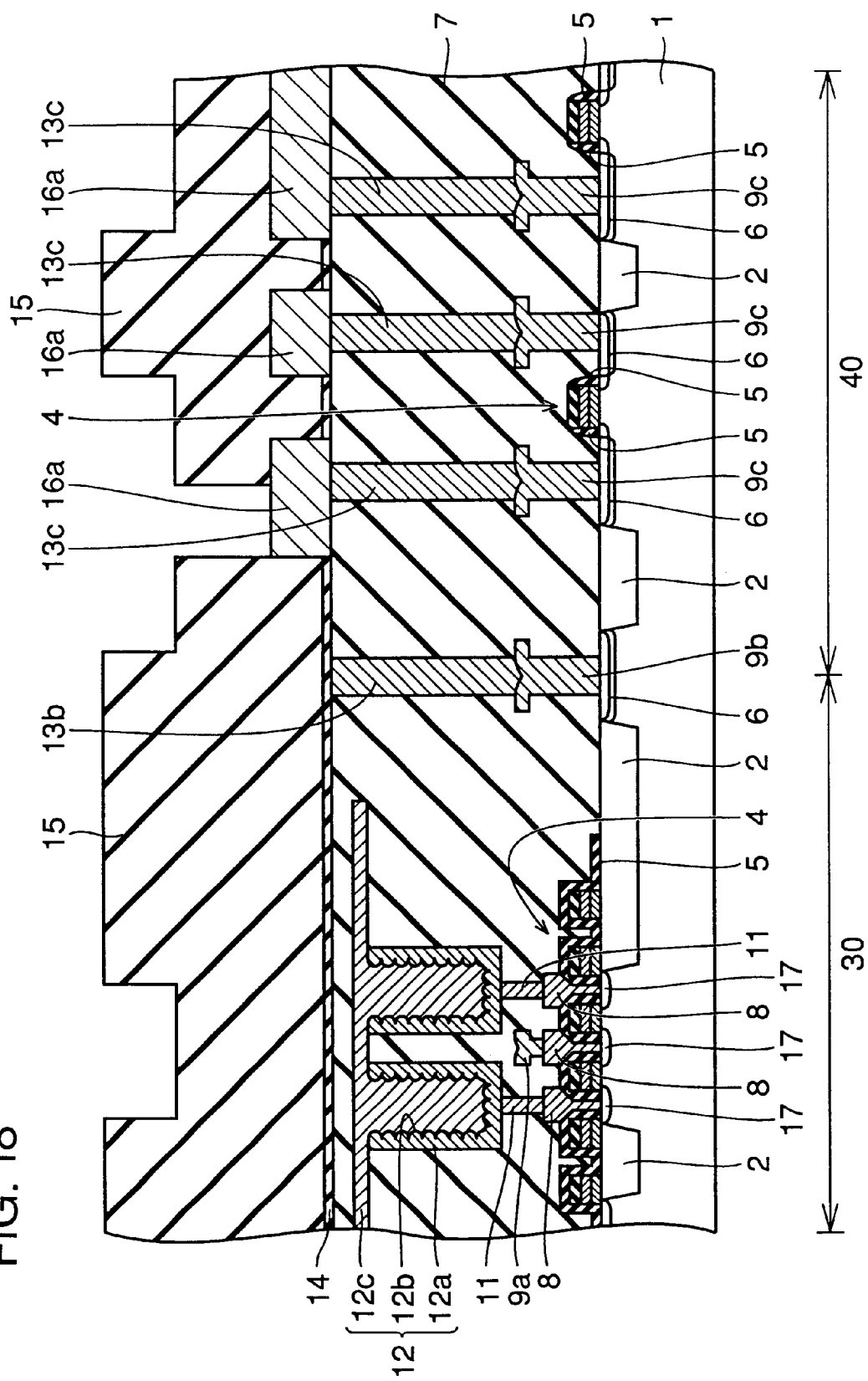
FIG. 18 is a cross sectional view of the stage in which second wiring grooves are formed.

Hereinafter, a method for manufacturing the above-described semiconductor device will be described. First, trench separation bands 2 (FIG. 4) are formed at a surface of a silicon substrate 1 (FIG. 3). Then, a gate insulating film 3 is formed, and a polysilicon film 4a, tungsten film 4b and silicon nitride film 4c are stacked thereon and patterned into gate electrodes 4 comprised of the films 4a to 4c (FIG. 5). By using the gate electrodes 4 or a sidewall 5 formed thereon as a mask, impurities are ion-implanted into the silicon substrate to form source/drain regions 6 and 17 (FIG. 6). Then, an interlayer insulating film 7a is formed, and polysilicon lift pads 8 are formed in the memory cell region 30 (FIG. 7). Thereafter, an insulating film 7b is formed, and a tungsten bit-line contact and bit line 9a are formed thereon (FIG. 8). Tungsten contacts 9c for contact with the wiring portion are formed in the peripheral circuit region 40 (FIG. 8). A tungsten vertical wall 9b as described above in connection with FIG. 2 is formed near the boundary between the peripheral circuit region 40 and memory cell region 30 (FIG. 8). This vertical wall 9b prevents copper diffusion even in a slight amount so that the copper atoms do not get into the memory cell region. Then, an insulating film 7c is formed, and a polysilicon capacitor contact 11 is formed on the lift pads 8 (FIG. 9). Thereafter, an interlayer insulating film 7d is formed, and a polysilicon capacitor lower electrode 12a having a rough surface is formed on the capacitor contacts 11 (FIG. 10). A dielectric layer 12b having a rough surface is formed thereon, and a capacitor upper electrode layer 12c is further formed thereon, thereby completing the capacitors 12 (FIG. 11). Then, an interlayer insulating film 7e is formed from a silicon oxide film (FIG. 12), and the plugs 9c are extended upward to form contacts 13c in the insulating films 7c, 7d and 7e (FIG. 13). Moreover, a vertical wall 13b extending along the vertical wall 9b is formed (FIG. 13). Thereafter, a ceiling film 14 is formed from a silicon nitride film over the memory cell region 30 and peripheral circuit region 40 (FIG. 14). This ceiling film 14 also serves to prevent copper diffusion even in a slight amount. An insulating film 15a is formed thereon and patterned to form wiring grooves (FIG. 15). A copper film is formed in the wiring grooves, whereby copper wires 16a are formed (FIG. 16). An insulating film 15b is formed thereon, and upper second wiring grooves are formed (FIGS. 17, 18). Embedded second wires 16b are formed from a copper film. The semiconductor device of the present embodiment is thus completed (FIG. 1).

With the ceiling film 14 of a silicon nitride film and the vertical walls 9b and 13b of a tungsten film, copper-diffusion blocking means is formed with a simple structure. Since this copper-diffusion blocking means is located away from the copper wires, copper diffusion is prevented even in a slight amount, so that even a slight amount of copper atoms no longer gets into the memory cell region. As a result, stored information is no longer destroyed by dissipation of charges in the capacitors, whereby a reliable, copper-wired semiconductor device can be obtained.

(Embodiment 2)

Figure 19:
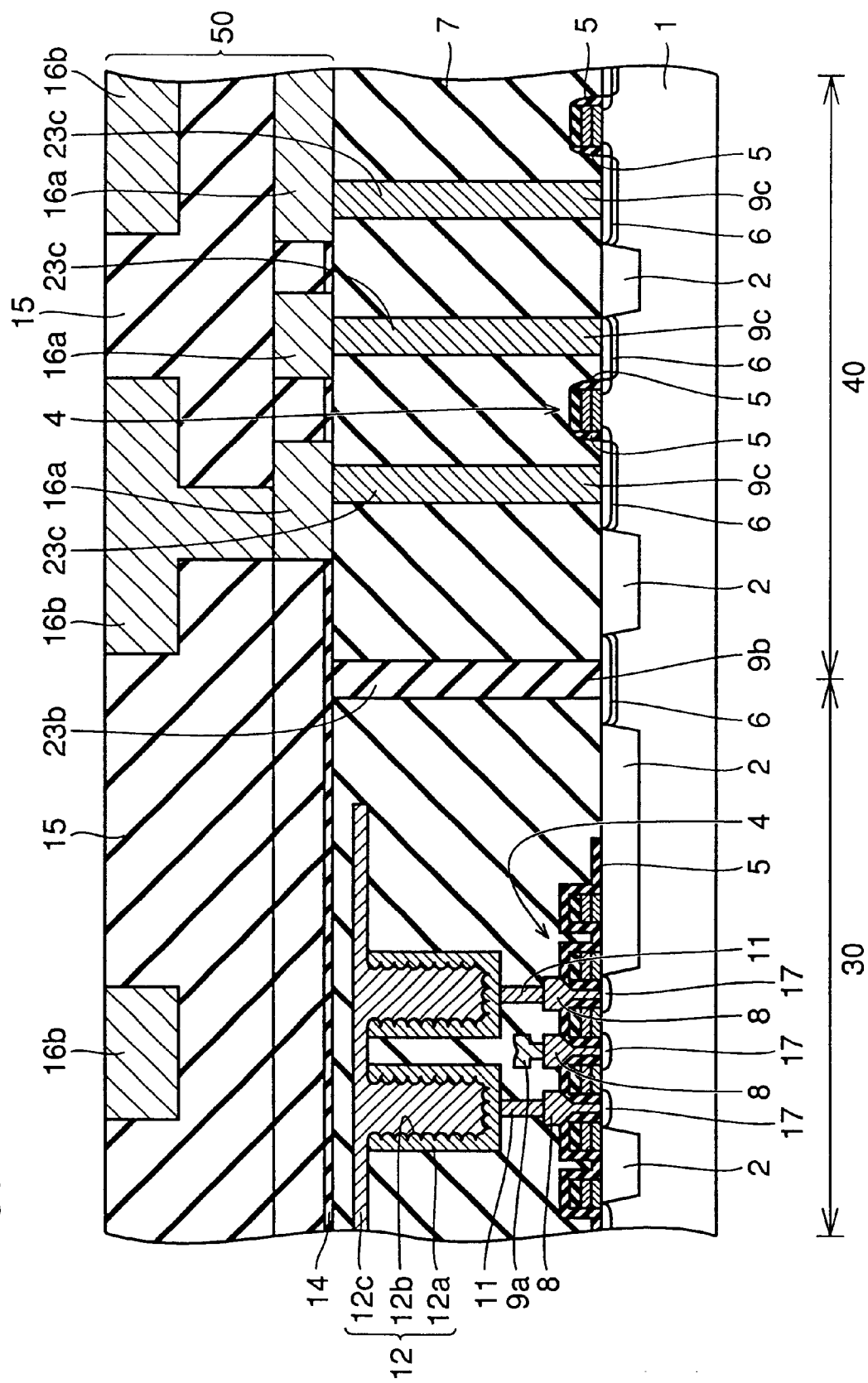
FIG. 19 is a cross sectional view of a semiconductor device according to a second embodiment of the present invention.

A semiconductor device of the second embodiment has the same structure as that of the semiconductor device of the first embodiment except the following points: a vertical wall 23b is formed from a silicon nitride film as shown in FIG. 19. The vertical wall 23b of the silicon nitride film as well as wiring contacts 23c are formed to extend from the silicon substrate to the top end in the same opportunity. According to the semiconductor device of the present embodiment, the copper-diffusion preventing film can be easily formed.

(Embodiment 3)

Figure 20:
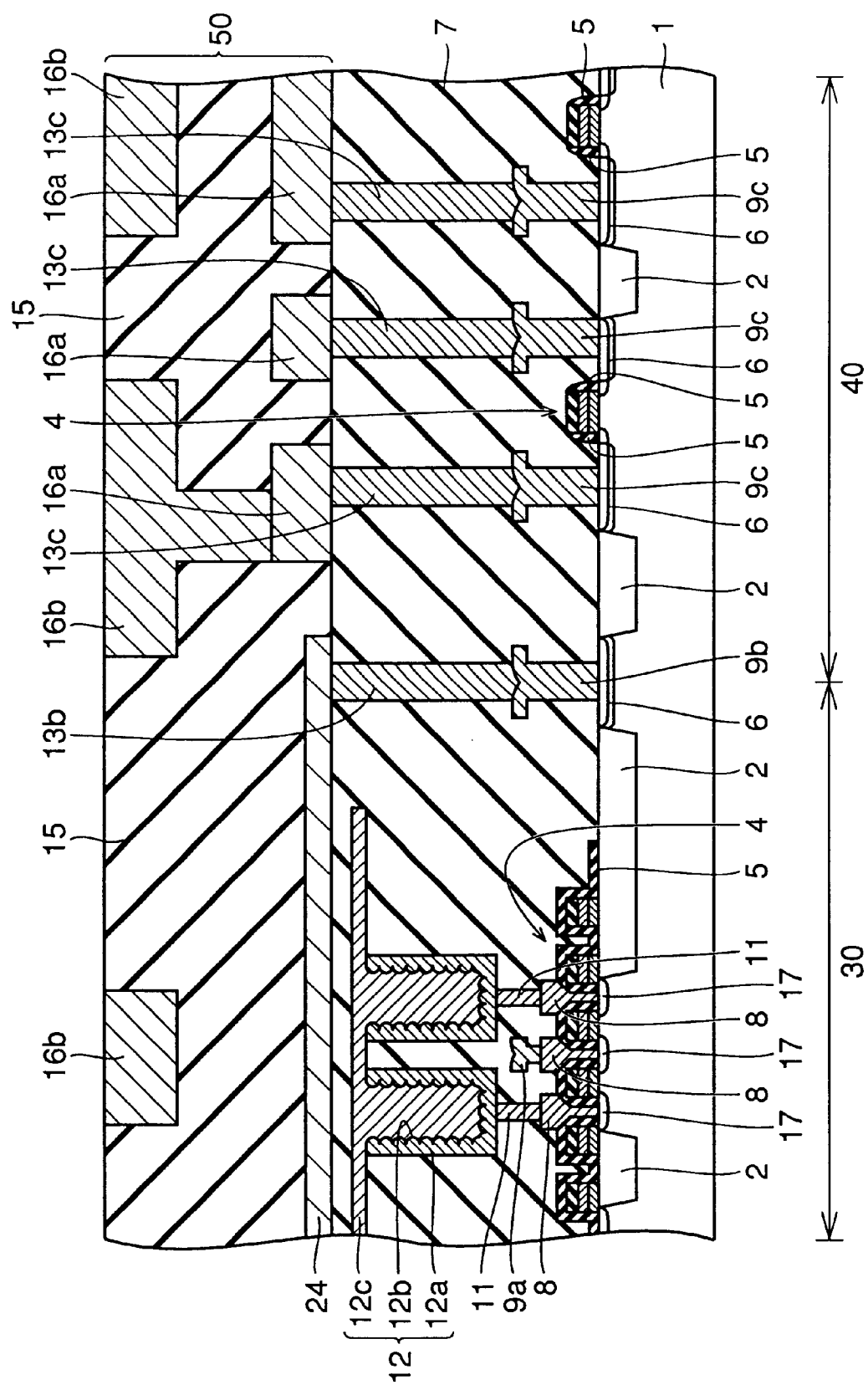
FIG. 20 is a cross sectional view of a semiconductor device according to a third embodiment of the present invention.

A semiconductor device of the third embodiment has the same structure as that of the semiconductor device of the first embodiment except that a ceiling film 24 is formed from an aluminum film as shown in FIG. 20. Aluminum has been conventionally used for wiring, and can be easily formed. The vertical walls 9b and 13b are formed by the same step and material as those of the first embodiment.

(Embodiment 4)

Figure 21:
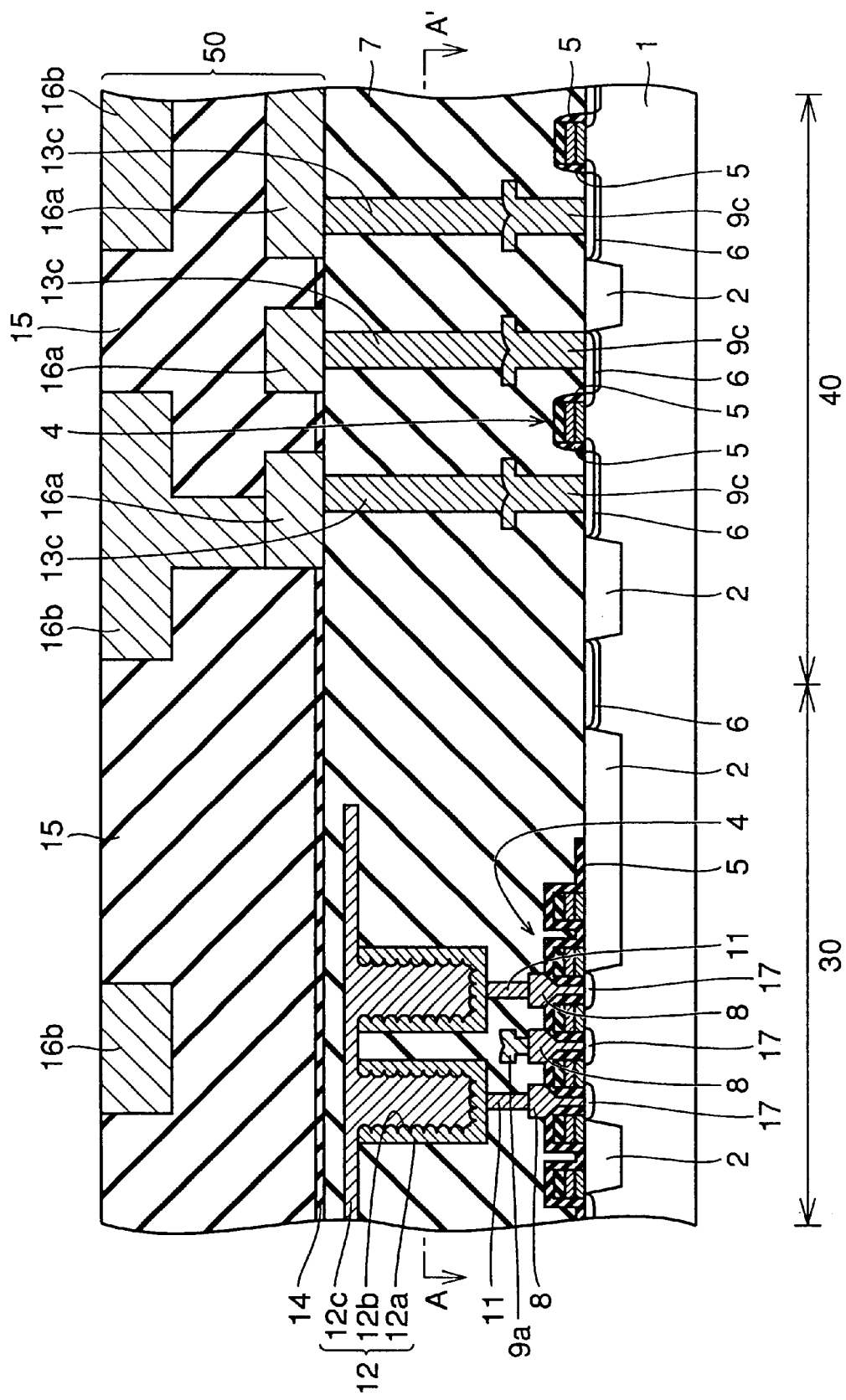
FIG. 21 is a cross sectional view of a semiconductor device according to a fourth embodiment of the present invention.
Figure 22:
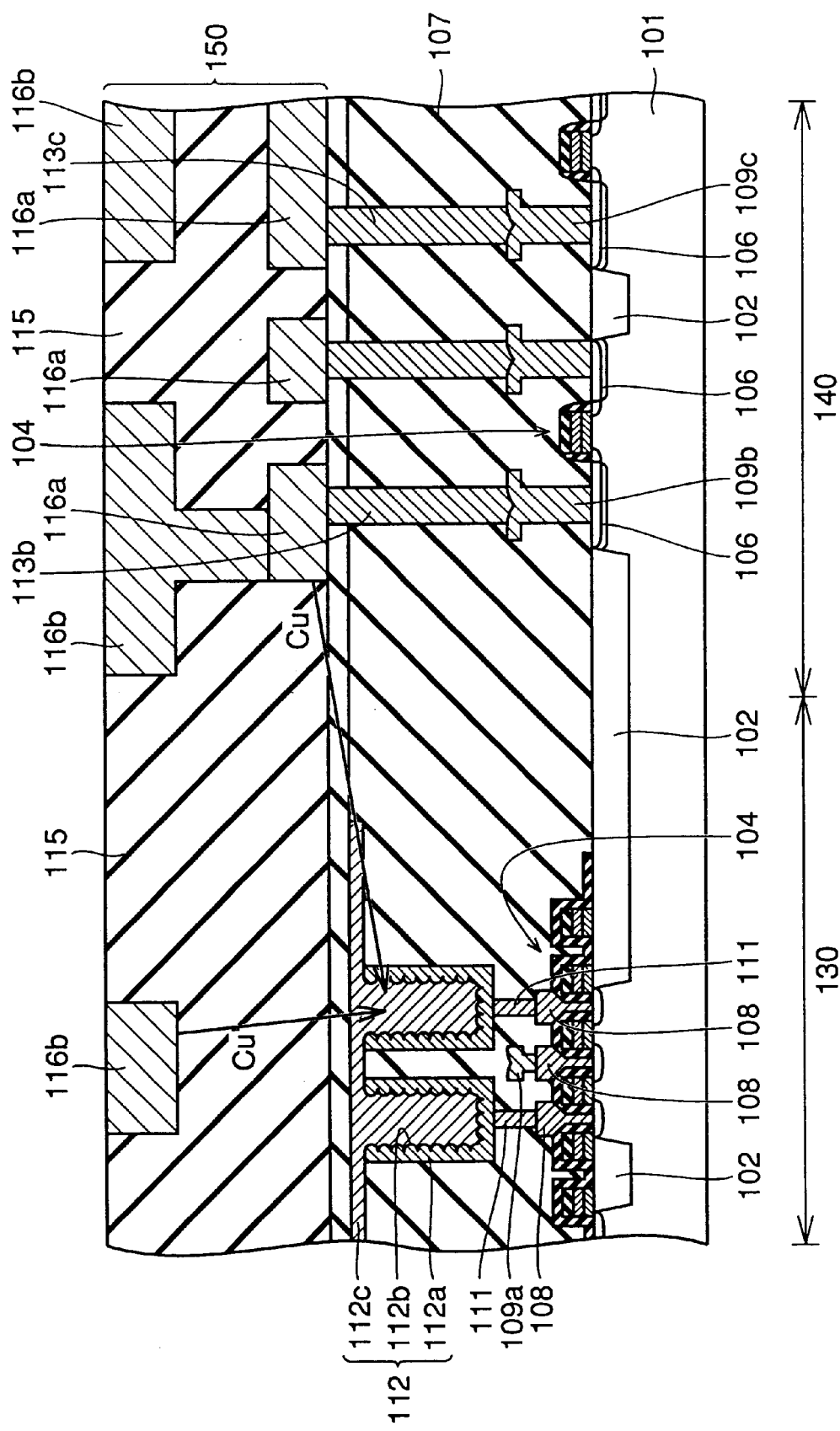
FIG. 22 is a cross sectional view of a conventional semiconductor device.

A semiconductor device of the fourth embodiment has the same structure as that of the semiconductor device of the first embodiment shown in FIG. 1 except that the vertical-wall-like copper-diffusion preventing films 9b and 13b are eliminated. Therefore, as shown in FIG. 21, the copper-diffusion preventing film 14 formed at the top-surface region serves to block copper diffusing into the memory storage portion. Thus, with the copper-diffusion preventing film 14 formed at the top-surface region, copper can be prevented from getting into the memory storage portion of the semiconductor device manufactured according to a prescribed manufacturing method for a prescribed period of use. Such prevention is more reliably achieved with a barrier layer that is normally provided on the copper wires of the wiring portion. Note that only the copper-diffusion preventing film at the top-surface region is shown in FIG. 21. However, the copper-diffusion preventing film at the top-surface region may be eliminated, and only the vertical-wall-like copper-diffusion preventing films 9b and 13b of FIG. 1 may be provided instead. In other words, only with the vertical walls 9b and 13b, the memory storage portion of the semiconductor device under a prescribed manufacturing method can be protected from copper for a prescribed period of use.

Although the present invention has been described and illustrated in detail, it is clearly understood that the same is by way of illustration and example only and is not to be taken by way of limitation, the sprit and scope of the present invention, being limited only by the terms of the appended claims.

What is claimed is:

1. A semiconductor device, comprising:
a semiconductor substrate,
a memory storage portion on a main surface of said semiconductor substrate,
a wiring portion including a copper wire positioned on the main surface of said semiconductor substrate and apart from said memory storage portion, and
copper-diffusion blocking means provided in a region surrounding the memory storage portion for blocking copper diffusion from said wiring portion toward said memory storage portion.

2. The semiconductor device according to claim 1, wherein the region surrounding the memory storage portion includes a top-surface region and a side-surface region of the memory storage portion, and the copper-diffusion blocking means is located in at least one of the top-surface region and the side-surface region.

3. The semiconductor device according to claim 2, wherein copper-diffusion blocking means that is provided in the top-surface region out of the copper-diffusion blocking means is located across the whole top-surface region.

4. The semiconductor device according to claim 2, wherein copper-diffusion blocking means that is provided in the side-surface region out of the copper-diffusion blocking means is located across the whole side-surface region.

5. The semiconductor device according to claim 1, wherein the region surrounding the memory storage portion includes a top-surface region and a side-surface region of the memory storage portion, and the copper-diffusion blocking means is located across a whole region of both the top-surface region and the side-surface region.

6. The semiconductor device according to claim 1, wherein the copper-diffusion blocking means is a copper-diffusion preventing film.

7. The semiconductor device according to claim 2, wherein the copper-diffusion blocking means is a copper-diffusion preventing film.

8. The semiconductor device according to claim 5, wherein the copper-diffusion blocking means is a copper-diffusion preventing film.

9. The semiconductor device according to claim 7, wherein the top-surface region includes an insulating film located over the memory storage portion, and the copper-diffusion preventing film is located in the insulating film so as to extend in parallel with a surface of the semiconductor substrate.

10. The semiconductor device according to claim 8, wherein the top-surface region includes an insulating film located over the memory storage portion, and the copper-diffusion preventing film is located in the insulating film so as to extend in parallel with a surface of the semiconductor substrate.

11. The semiconductor device according to claim 7, wherein the side-surface region includes an insulating film surrounding the memory storage portion, and the copper-diffusion preventing film is formed like a vertical wall in the insulating film so as to cross a surface of the semiconductor substrate.

12. The semiconductor device according to claim 8, wherein the side-surface region includes an insulating film surrounding the memory storage portion, and the copper-diffusion preventing film is formed like a vertical wall in the insulating film so as to cross a surface of the semiconductor substrate.

13. The semiconductor device according to claim 1, wherein the memory storage portion is a memory storage portion for accumulating and releasing charges according to information.

14. The semiconductor device according to claim 2, wherein the memory storage portion is a memory storage portion for accumulating and releasing charges according to information.

15. The semiconductor device according to claim 6, wherein each copper-diffusion preventing film forming the copper-diffusion blocking means is any one of a tungsten film, an aluminum film, a silicon nitride film, a tantalum film and a tantalum nitride film.

16. The semiconductor device according to claim 7, wherein each copper-diffusion preventing film forming the copper-diffusion blocking means is any one of a tungsten film, an aluminum film, a silicon nitride film, a tantalum film and a tantalum nitride film.

17. The semiconductor device according to claim 8, wherein each copper-diffusion preventing film forming the copper-diffusion blocking means is any one of a tungsten film, an aluminum film, a silicon nitride film, a tantalum film and a tantalum nitride film.

\* \* \* \* \*